(12) United States Patent
Huang

(10) Patent No.: US 11,774,192 B2
(45) Date of Patent: Oct. 3, 2023

(54) WATER COOLING RADIATOR WITH BUILT-IN WATER PUMP

(71) Applicant: Dongguan Hanxu Hardware Plastic Technology Co., Ltd., Guangdong (CN)

(72) Inventor: Tsung-Hsien Huang, Dongguan (CN)

(73) Assignee: DONGGUAN HANXU HARDWARE PLASTIC TECHNOLOGY CO., LTD., Guangdong (CN)

( * ) Notice: Subject to any disclaimer, the term of this patent is extended or adjusted under 35 U.S.C. 154(b) by 5 days.

(21) Appl. No.: 17/170,899

(22) Filed: Feb. 9, 2021

(65) Prior Publication Data

US 2022/0170705 A1  Jun. 2, 2022

(30) Foreign Application Priority Data

Nov. 30, 2020 (CN) .......................... 202011370402.2

(51) Int. Cl.
| | |
|---|---|
| *F28F 9/02* | (2006.01) |
| *H05K 7/20* | (2006.01) |
| *H01L 23/473* | (2006.01) |
| *F28F 9/18* | (2006.01) |

(52) U.S. Cl.
CPC .......... *F28F 9/0202* (2013.01); *F28F 9/0258* (2013.01); *F28F 9/18* (2013.01); *F28F 2250/08* (2013.01); *H01L 23/473* (2013.01); *H05K 7/20263* (2013.01); *H05K 7/20272* (2013.01)

(58) Field of Classification Search
CPC ............ H05K 7/20272; H05K 7/20263; H01L 23/473; F28F 9/0202; F28F 9/0258; F28F 9/18

See application file for complete search history.

(56) References Cited

U.S. PATENT DOCUMENTS

| | | | |
|---|---|---|---|
| 2006/0185378 A1* | 8/2006 | Duan ................. | H05K 7/20263 62/259.2 |
| 2009/0044929 A1* | 2/2009 | Yeh ........................ | F28D 15/00 165/104.19 |
| 2011/0056668 A1* | 3/2011 | Taras ...................... | F28F 9/262 165/174 |
| 2013/0299139 A1* | 11/2013 | Mounioloux ....... | F28D 1/05375 165/120 |
| 2017/0367217 A1* | 12/2017 | Xiao ................... | H01L 23/3672 |

* cited by examiner

*Primary Examiner* — Paul Alvare
(74) *Attorney, Agent, or Firm* — Leong C. Lei

(57) ABSTRACT

A water-cooling radiator includes a first water collection box, a second water collection box and a plurality of radiating pipes. A water pump chamber is disposed in a box body, and is in cooperation with a water pump, an impeller and a water pump cover to form a water pump structure with good airtightness, so that the water pump and the first water collection box are effectively combined. The flow speed of water in the water-cooling radiator is effectively accelerated, which improves the heat dissipation efficiency. The overall heat dissipation effect of the product is very good.

9 Claims, 4 Drawing Sheets

WATER COOLING RADIATOR WITH BUILT-IN WATER PUMP

BACKGROUND OF THE INVENTION

1. Field of the Invention

The present invention relates to a water-cooling radiator, and more particularly to a water-cooling radiator with a built-in water pump.

2. Description of the Prior Art

A water-cooling radiator is configured to radiate the heat of the radiator using a liquid under the action of a pump. Compared with air cooling, the water-cooling radiator has the advantages of quietness, stable cooling, and less dependence on the environment. The heat dissipation performance of the water-cooling radiator is proportional to the flow rate of a cooling liquid (water or other liquid). The flow rate of the cooling liquid is related to the power of the pump in the cooling system. Moreover, the heat capacity of water is large. This makes the water-cooling system have a good heat load capacity.

A conventional water-cooling radiator assembly usually consists of a water-cooling radiator, a water-cooling block, and a water pipe. The water pipe is connected between the water-cooling radiator and the water-cooling block. The water pipe allows water in the water-cooling radiator and the water-cooling block to circulate. After the water absorbs the heat from the water-cooling block, the water flows to the water-cooling radiator for heat dissipation, and the water after heat dissipation flows back to the water-cooling block. In the prior art, the water-cooling radiator of the water-cooling radiator assembly has a water collection box. The water collection box has no water pump function, which makes the water flow in the water-cooling radiator slower and the heat dissipation efficiency is low. In addition, there is no partition in the water collection box, which makes the distance of the water flow in the water-cooling radiator shorter so that the water cannot cool and dissipate heat effectively. Therefore, it is necessary to improve the conventional water-cooling radiator.

SUMMARY OF THE INVENTION

In view of the defects of the prior art, the primary object of the present invention is to provide a water-cooling radiator with a built-in water pump, which can effectively solve the problem of poor heat dissipation of the conventional water-cooling radiator and the inability to effectively cool and dissipate heat for water.

In order to achieve the above object, the present invention adopts the following technical solutions:

According to one aspect of the present invention, a water-cooling radiator comprises a first water collection box, a second water collection box and a plurality of radiating pipes. The radiating pipes are provided with radiating fins. Two ends of the radiating pipes communicate with the first water collection box and the second water collection box, respectively. The first water collection box includes a box body, a box cover, and a water pump cover. The box body is made of heat-dissipating metal. A water pump chamber is formed in the box body. A partition is provided in the box body. The partition is configured to separate an inside of the box body into a water inlet chamber and a water outlet chamber that are separate from each other. The water outlet chamber communicates with the water pump chamber. The box body is formed with a water inlet and a water outlet. The water inlet communicates with the water inlet chamber. The water outlet communicates with the water pump chamber. A water pipe joint is installed to each of the water inlet and the water outlet in a sealed manner. The box cover is fixed to the box body and configured to seal openings of the water inlet chamber and the water outlet chamber. The box cover is formed with a plurality of installation grooves. The ends of some of the radiating pipes are hermetically installed in some of the installation grooves and communicate with the water inlet chamber. The ends of the others of the radiating pipes are hermetically installed in the others of the installation grooves and communicate with the water outlet chamber. The water pump cover is fixed to the box body and configured to seal an opening of the water pump chamber. A water pump is fixed to an inner side of the water pump cover. An impeller is connected to an output shaft of the water pump. The impeller is located in the water pump chamber and driven to rotate by the water pump.

According to another aspect of the present invention, a water-cooling radiator comprises a first water collection box, a second water collection box and a plurality of radiating pipes. Two ends of the radiating pipes communicate with the first water collection box and the second water collection box, respectively. The radiating pipes are provided with radiating fins. The first water collection box includes a box body, a box cover, and a water pump cover. The box body is made of heat-dissipating metal. A partition is provided in the box body. The partition is configured to separate an inside of the box body into a water inlet chamber and a water outlet chamber that are separate from each other. The box body is formed with a water inlet and a water outlet. The water inlet communicates with the water inlet chamber. A water pipe joint is installed to each of the water inlet and the water outlet in a sealed manner. The box body is formed with a plurality of installation grooves. The ends of some of the radiating pipes are hermetically installed in some of the installation grooves and communicate with the water inlet chamber. The ends of the others of the radiating pipes are hermetically installed in the others of the installation grooves and communicate with the water outlet chamber. The box cover is fixed to the box body and configured to seal openings of the water inlet chamber and the water outlet chamber. The box cover is formed with a water pump chamber. The water outlet chamber communicates with the water pump chamber. The water outlet communicates with the water pump chamber. The water pump cover is fixed to the box cover and configured to seal an opening of the water pump chamber. A water pump is fixed to an inner side of the water pump cover. An impeller is connected to an output shaft of the water pump. The impeller is located in the water pump chamber and driven to rotate by the water pump.

Compared with the prior art, the present invention has obvious advantages and beneficial effects. Specifically, it can be known from the above technical solutions:

The water pump chamber is integrally formed in the box body, and is in cooperation with the water pump, the impeller and the water pump cover to form a water pump structure with good airtightness, so that the water pump and the first water collection box are effectively combined. The flow speed of water in the water-cooling radiator is effectively accelerated, which improves the heat dissipation efficiency. Besides, the partition is arranged in the box body to divert the hot water from the water inlet, which greatly extends the flow of water in the water-cooling radiator, so that the water can be effectively cooled to dissipate the heat, and the overall heat dissipation effect of the product is very good.

DETAILED DESCRIPTION OF THE PREFERRED EMBODIMENTS

Figure 1:
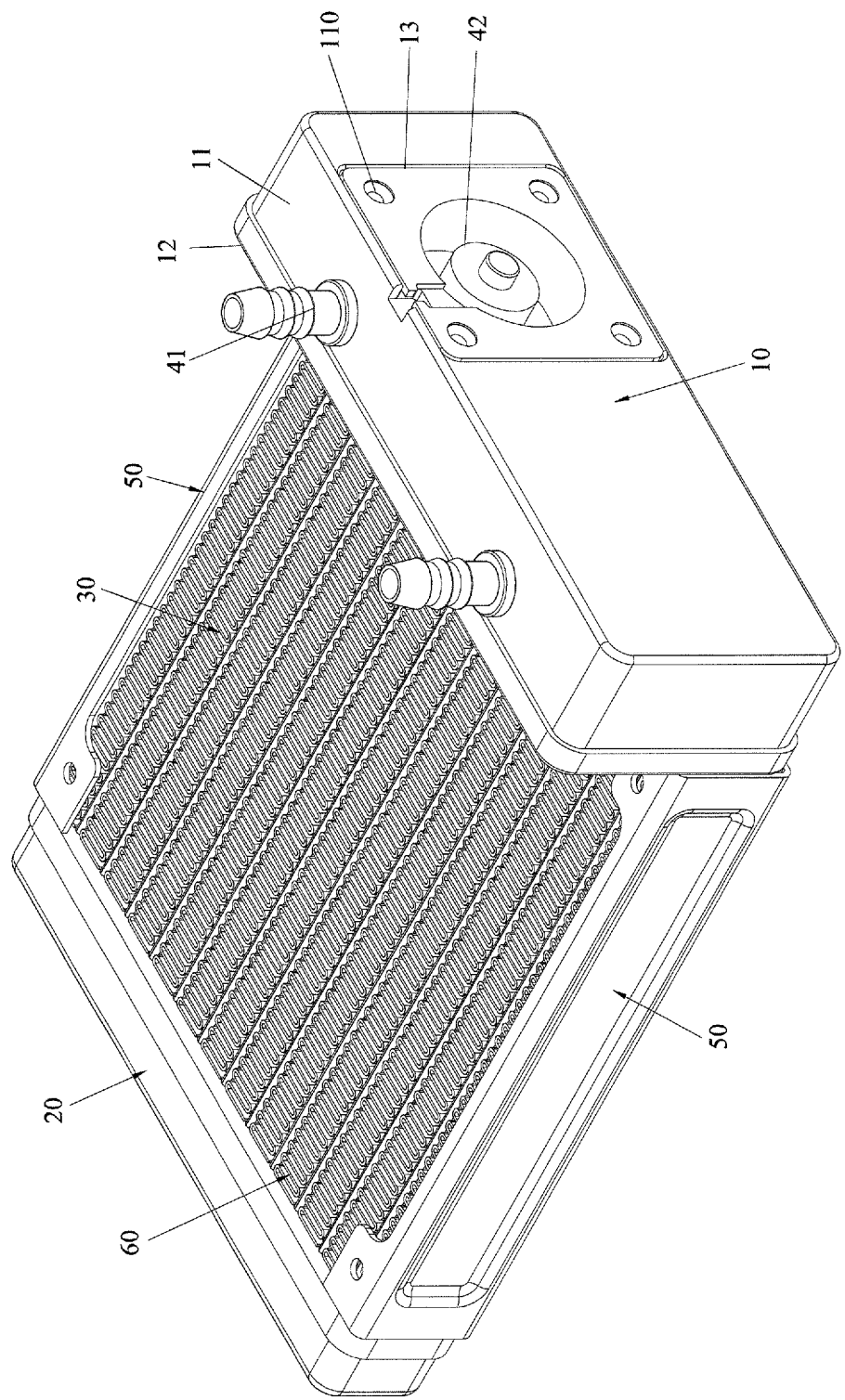
FIG. 1 is a perspective view according to a first embodiment of the present invention.
Figure 2:
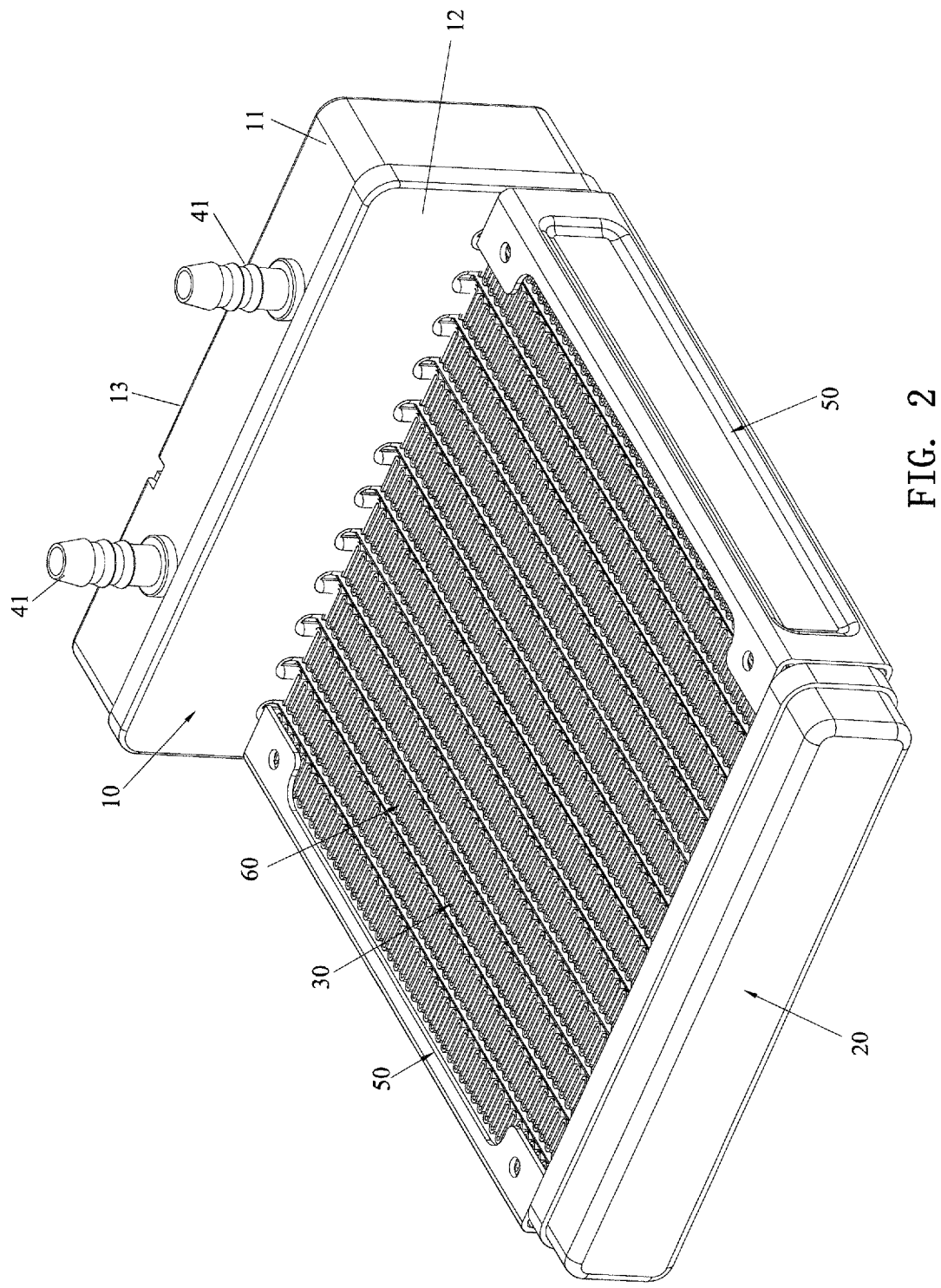
FIG. 2 is another perspective view according to the first embodiment of the present invention.
Figure 3:
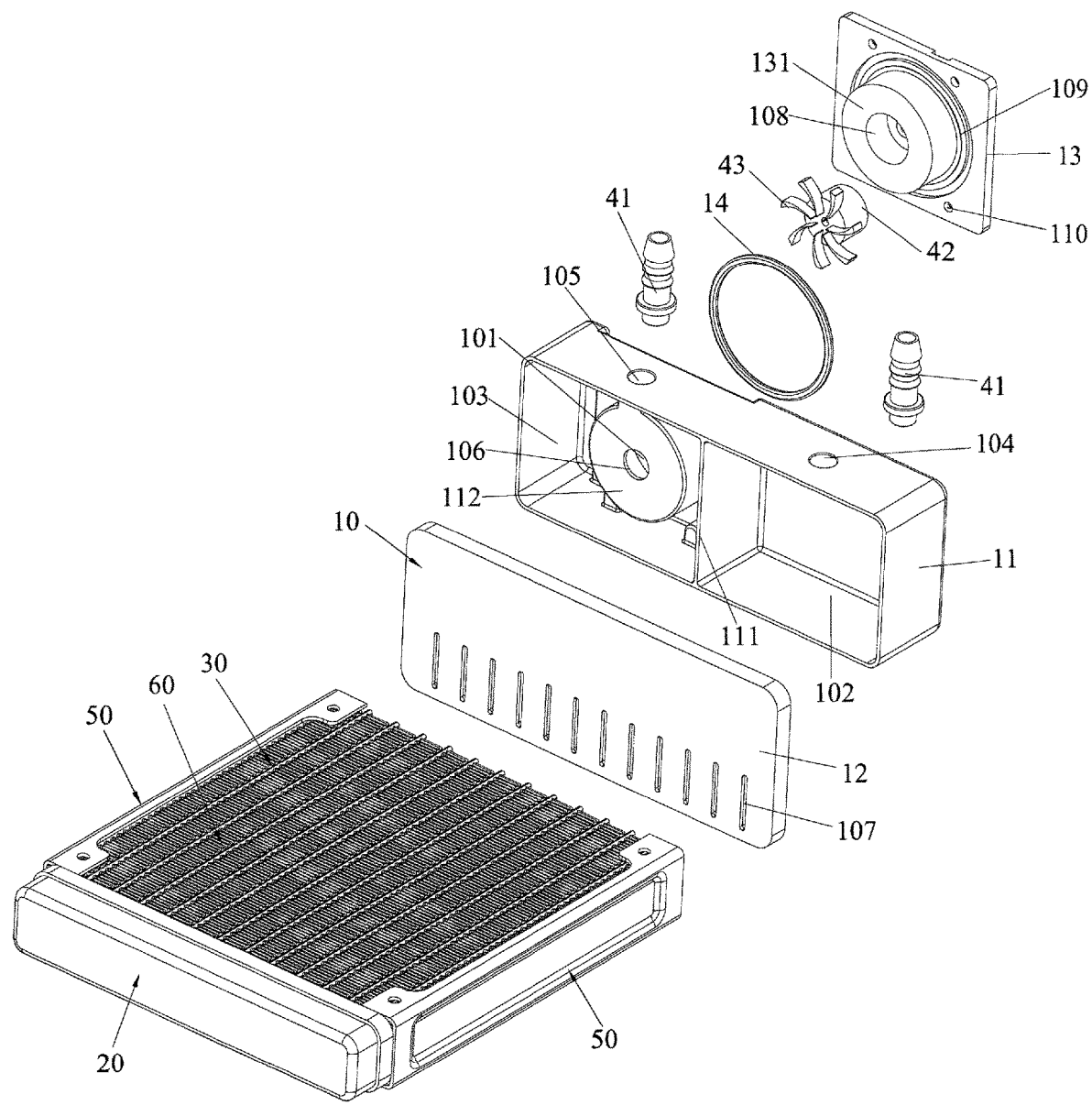
FIG. 3 is an exploded view according to the first embodiment of the present invention.

FIGS. 1 to 3 show the specific structure of a first embodiment of the present invention, comprising a first water collection box 10, a second water collection box 20 and a plurality of radiating pipes 30. Radiating fins 60 are provided on the radiating pipes 30. Two ends of the radiating pipes 30 communicate with the first water collection box 10 and the second water collection box 20, respectively.

The first water collection box 10 includes a box body 11, a box cover 12, and a water pump cover 13. The box body 11 is made of heat-dissipating metal. A water pump chamber 101 is formed in the box body 11. A partition 111 is provided in the box body 11. The partition 111 is configured to separate the inside of the box body 11 into a water inlet chamber 102 and a water outlet chamber 103 that are separate from each other. The water outlet chamber 103 communicates with the water pump chamber 101. The box body 11 is formed with a water inlet 104 and a water outlet 105. The water inlet 104 communicates with the water inlet chamber 102. The water outlet 105 communicates with the water pump chamber 101. A water pipe joint 41 is installed to each of the water inlet 104 and the water outlet 105 in a sealed manner. In this embodiment, the box body 11 is made of copper or aluminum. The water outlet chamber 103 is integrally formed with a boss 112. The water pump chamber 101 is integrally formed and located on the back of the boss 112. The boss 112 is formed with a flow channel 106 communicating with the water outlet chamber 103 and the water pump chamber 101. The partition 111 is installed in the box body 11 by welding or integrally formed with the box body 11. In this embodiment, the partition 111 and the boss 112 are integrally formed with the box body 11 by stamping and forging to achieve a better water separation effect. The water pipe joint 41 is inserted into the water inlet 104 or the water outlet 105 and is hermetically fixed to the box body 11 by welding.

The box cover 12 is fixed to the box body 11 and configured to seal the openings of the water inlet chamber 102 and the water outlet chamber 103. The box cover 12 is formed with a plurality of installation grooves 107. The ends of some of the radiating pipes 30 are hermetically installed in some of the installation grooves 107 and communicate with the water inlet chamber 102. The ends of the others of the radiating pipes 30 are hermetically installed in the others of the installation grooves 107 and communicate with the water outlet chamber 103. In this embodiment, the box cover 12 is located in front of the box body 11. The box cover 12 is also made of heat-dissipating metal. The box cover 12 is hermetically fixed to the box body 11 by welding. The radiating pipes 30 are all flat pipes and are hermetically fixed to the box cover 12 by welding. Of course, the radiating pipes 30 may be round pipes, but not limited thereto.

The water pump cover 13 is fixed to the box body 11 and configured to seal the opening of the water pump chamber 101. A water pump 42 is fixed to the inner side of the water pump cover 13. An impeller 43 is connected to an output shaft of the water pump 42. The impeller 43 is located in the water pump chamber 101 and is driven to rotate by the water pump 42. In this embodiment, the inner side of the water pump cover 13 is formed with a protruding portion 131. The protruding portion 131 is matched with the water pump chamber 101. The protruding portion 131 is inserted in the water pump chamber 101. The surface of the protruding portion 131 is formed with a recess 108. The water pump 42 is inserted and fixed in the recess 108. The protruding portion 131 is in the shape of a truncated cone. A sealing ring 14 is sandwiched between the water pump cover 13 and the box body 11. In this embodiment, the inner side of the water pump cover 13 is formed with an annular positioning groove 109. The annular positioning groove 109 is located on the periphery of the protruding portion 131. The sealing ring 14 is embedded and fixed in the annular positioning groove 109. In addition, the water pump cover 13 is formed with a first fixing hole 110, the box body 11 is formed with a second fixing hole (not shown), and a fixing bolt (not shown) passes through the first fixing hole 110 and is fixedly connected to the second fixing hole, so that the water pump cover 13 can be disassembled and removed as needed to maintain the water pump 42 and the impeller 43, which is convenient for use.

In addition, two fan brackets 50 are connected between the first water collection box 10 and the second water collection box 20. The two fan brackets 50 are arranged on the left and right sides of the water-cooling radiator. The radiating pipes 30 are located between the two fan brackets 50, so that the overall structure of the product is more stable, and a fan can be installed and fixed.

The working principle of this embodiment is described in detail as follows:

When in use, a water outlet pipe is connected to the water pipe connector 41 that communicates with the water pump chamber 101, and a water inlet pipe is connected to another water pipe connector 41. The water with heat is output from the water inlet pipe and is input into the water inlet chamber 102 through the corresponding water pipe joint 41, and flows through the corresponding radiating pipes 30 into the second water collection box 20, and then flows into the water outlet chamber 103 through the other radiating pipes 30, and flows into the water pump chamber 101 through the flow channel 106. At this time, the water pump 42 is started and drives the impeller 43 to run at a high speed, so that the pressurized water entering the water pump chamber 101 is output from the corresponding water pipe joint 41 into the water outlet pipe. In the process of water flowing through the first water collection box 10, the second water collection box 20 and each radiating pipe 30, the heat is absorbed, so as to realize cooling and heat dissipation. The water pump 42 speeds up the flow of water in the first water collection box 10, the second water collection box 20 and each radiating pipe 30, so as to effectively improve the heat dissipation efficiency.

Figure 4:
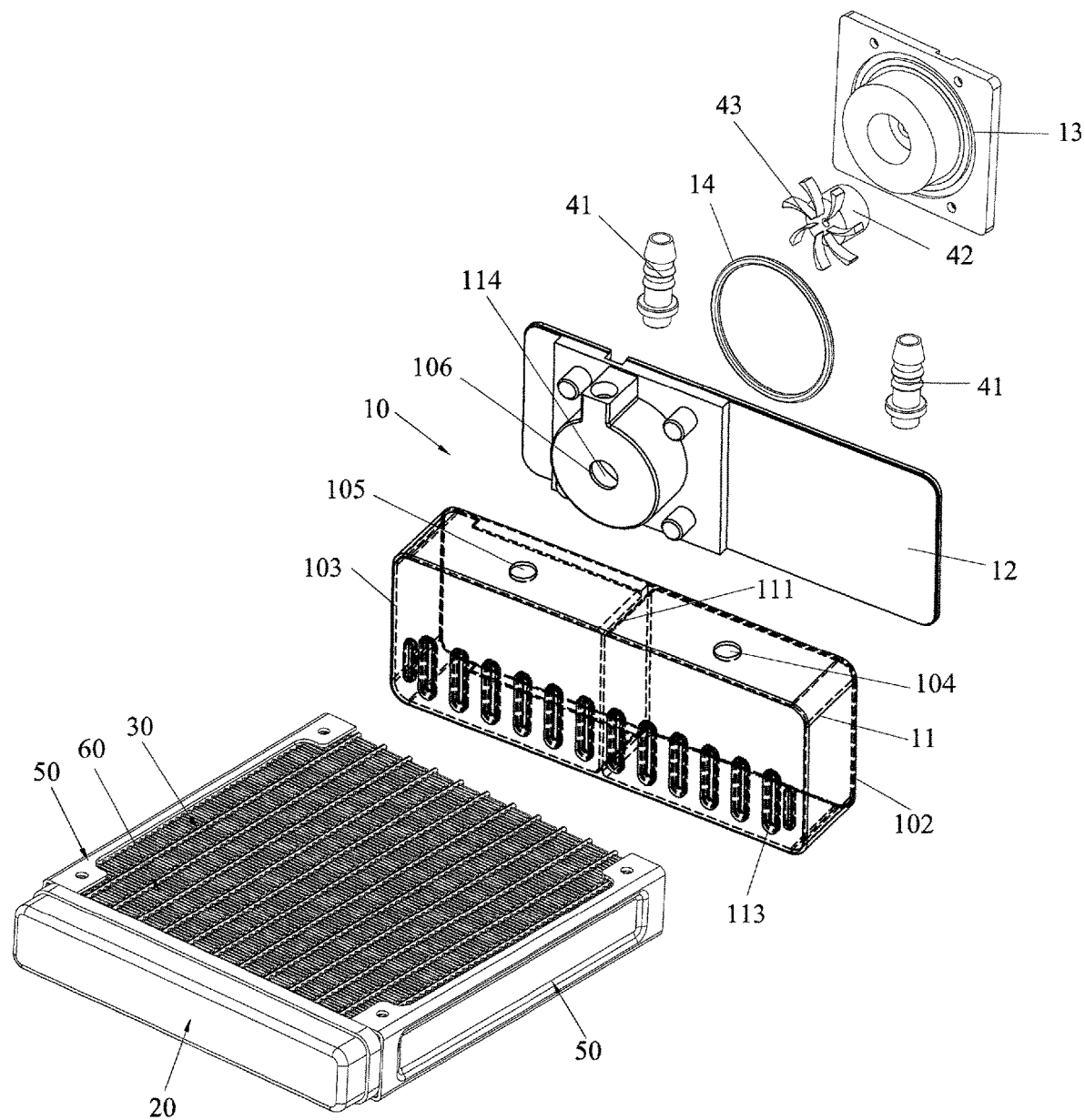
FIG. 4 is an exploded view according to a second embodiment of the present invention.

FIG. 4 shows the specific structure of a second embodiment of the present invention. The specific structure of the second embodiment is substantially similar to the specific structure of the first embodiment with the exceptions described hereinafter.

In this embodiment, the box cover 12 is located behind the box body 11, and the box body 11 is formed with a plurality of installation grooves 113. The ends of some of the radiating pipes 30 are hermetically installed in some of the installation grooves 113 and communicate with the water inlet chamber 102. The ends of the others of the radiating pipes 30 are hermetically installed in the others of the installation grooves 113 and communicate with the water outlet chamber 103. The box cover 12 is fixed to the box body 11 and configured to seal the openings of the water inlet chamber 102 and the water outlet chamber 103. The box cover 12 is formed with a water pump chamber 114. The water outlet chamber 103 communicates with the water pump chamber 114. The water outlet 105 communicates with the water pump chamber 114. The water pump cover 13 is fixed to the box cover 12 and configured to seal the opening of the water pump chamber 114.

The working principle of this embodiment is the same as that of the aforementioned first embodiment, and the working principle of this embodiment will not be described in detail here.

What is claimed is:

1. A water-cooling radiator, comprising a first water collection box, a second water collection box and a plurality of radiating pipes;
   two ends of the radiating pipes communicating with the first water collection box and the second water collection box respectively, the radiating pipes being provided with radiating fins, the first water collection box including a box body, a box cover, and a water pump cover; the box body being made of heat-dissipating metal, a water pump chamber being arranged in and separated from an internal space of the box body, a partition being provided in the box body, the partition being configured to separate the internal space of the box body into a water inlet chamber and a water outlet chamber that are separate from each other, the water outlet chamber communicating with the water pump chamber, the box body being formed with a water inlet and a water outlet, the water inlet communicating with the water inlet chamber, the water outlet communicating with the water pump chamber, a water pipe joint being installed to each of the water inlet and the water outlet in a sealed manner; the box cover being fixed to the box body and configured to seal openings of the water inlet chamber and the water outlet chamber, the box cover being formed with a plurality of installation grooves; the ends of some of the radiating pipes being hermetically installed in some of the installation grooves and communicating with the water inlet chamber, the ends of the others of the radiating pipes being hermetically installed in the others of the installation grooves and communicating with the water outlet chamber; the water pump cover being fixed to the box body and configured to seal an opening of the water pump chamber, a water pump being fixed to an inner side of the water pump cover, an impeller being connected to an output shaft of the water pump, the impeller being located in the water pump chamber and driven to rotate by the water pump,
   wherein the box cover is fixed to and combined with the box body to enclose the internal space of the box body, the combination of the box cover and the box body forming an enclosed container having a first wall and an opposite second wall connected together by means of a circumferential wall, the first wall having an outside surface that is shaped to form a boss located in the internal space of the box body, the boss being spaced from the second wall, wherein the boss has a back side defined by the outside surface of the first wall, the back side facing away from and spaced from the second wall, and the back side of the boss forms an external space separated from the internal space and located outside the container to form the water pump chamber, such that the water pump chamber is separated from the internal space of the box body, and wherein the water pump cover is fixed to the box body to close the opening of the water pump chamber and the water pump is located in the external space defined by the boss and is separated from the internal space of the box body, wherein the boss is formed with a part of the outside surface of the first wall, a remaining part of the outside surface of the first wall and the water pump cover jointly defining a first plane that is opposite to and spaced from a second plane defined by the second wall, the boss being located between the first and second planes, the water pump being located between the first and second planes, wherein the outside surface of the first wall forms a planar surface and the water pump cover is flush with the planar surface of the outside surface of the first wall, so that the water pump is completely located inboard of the planar surface of the outside surface of the first wall; and
   wherein the inner side of the water pump cover is formed with a protruding portion matched with the water pump chamber, the protruding portion being inserted in the water pump chamber, a surface of the protruding portion being formed with a recess, in which the water pump is inserted and fixed.

2. The water-cooling radiator as claimed in claim 1, wherein the boss is formed with a flow channel communicating with the water outlet chamber and the water pump chamber.

3. The water-cooling radiator as claimed in claim 1, wherein the partition is installed in the box body by welding or integrally formed with the box body.

4. The water-cooling radiator as claimed in claim 1, wherein the box body is made of copper or aluminum, the box cover is made of heat-dissipating metal, and the box cover is hermetically fixed to the box body by welding.

5. The water-cooling radiator as claimed in claim 1, wherein the water pipe joint is inserted into the water inlet or the water outlet and is hermetically fixed to the box body by welding.

6. The water-cooling radiator as claimed in claim 1, wherein a sealing ring is sandwiched between the water pump cover and the box body.

7. The water-cooling radiator as claimed in claim 1, wherein the water pump cover is formed with a first fixing hole, the box body is formed with a second fixing hole, and a fixing bolt passes through the first fixing hole and is fixedly connected to the second fixing hole.

8. The water-cooling radiator as claimed in claim 1, wherein two fan brackets are connected between the first water collection box and the second water collection box, the two fan brackets are arranged on left and right sides of the water-cooling radiator, and the radiating pipes are located between the two fan brackets.

9. A water-cooling radiator, comprising a first water collection box, a second water collection box and a plurality of radiating pipes; two ends of the radiating pipes communicating with the first water collection box and the second water collection box respectively, the radiating pipes being provided with radiating fins, the first water collection box including a box body, a box cover, and a water pump cover; the box body being made of heat-dissipating metal, a partition being provided in the box body, the partition being configured to separate an internal space of the box body into a water inlet chamber and a water outlet chamber that are separate from each other, the box body being formed with a water inlet and a water outlet, the water inlet communicating with the water inlet chamber, a water pipe joint being installed to each of the water inlet and the water outlet in a sealed manner, the box body being formed with a plurality of installation grooves, the ends of some of the radiating pipes being hermetically installed in some of the installation grooves and communicating with the water inlet chamber, the ends of the others of the radiating pipes being hermetically installed in the others of the installation grooves and communicating with the water outlet chamber; the box cover being fixed to the box body and configured to seal openings of the water inlet chamber and the water outlet chamber, the box cover being formed with a water pump chamber, the water outlet chamber communicating with the water pump chamber, the water outlet communicating with the water pump chamber; the water pump cover being fixed to the box cover and configured to seal an opening of the water pump chamber, a water pump being fixed to an inner side of the water pump cover, an impeller being connected to an output shaft of the water pump, the impeller being located in the water pump chamber and driven to rotate by the water pump, wherein the box cover is fixed to and combined with the box body to enclose the internal space of the box body, the combination of the box cover and the box body forming an enclosed container having a first wall and an opposite second wall connected together by means of a circumferential wall, the first wall having an outside surface that is shaped to form a boss located in the internal space of the box body, the boss being spaced from the second wall, wherein the boss has a back side defined by the outside surface of the first wall, the back side facing away from and spaced from the second wall, and the back side of the boss forms an external space separated from the internal space and located outside the container to form the water pump chamber, such that the water pump chamber is separated from the internal space of the box body, and wherein the water pump cover is fixed to the box body to close the opening of the water pump chamber and the water pump is located in the external space defined by the boss and is separated from the internal space of the box body, wherein the boss is formed with a part of the outside surface of the first wall, a remaining part of the outside surface of the first wall and the water pump cover jointly defining a first plane that is opposite to and spaced from a second plane defined by the second wall, the boss being located between the first and second planes, the water pump being located between the first and second planes, wherein the outside surface of the first wall forms a planar surface and the water pump cover is flush with the planar surface of the outside surface of the first wall, so that the water pump is completely located inboard of the planar surface of the outside surface of the first wall; and wherein the inner side of the water pump cover is formed with a protruding portion matched with the water pump chamber, the protruding portion being inserted in the water pump chamber, a surface of the protruding portion being formed with a recess, in which the water pump is inserted and fixed.

\* \* \* \* \*